US007961001B1

(12) United States Patent
Ko (10) Patent No.: US 7,961,001 B1
(45) Date of Patent: Jun. 14, 2011

(54) IMPEDANCE ADJUSTING DEVICE

(75) Inventor: Hyeong-Jun Ko, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/647,239

(22) Filed: Dec. 24, 2009

(30) Foreign Application Priority Data

Nov. 30, 2009 (KR) ........................ 10-2009-0117428

(51) Int. Cl.
*H03K 17/16* (2006.01)
*H03B 1/00* (2006.01)

(52) U.S. Cl. .............. 326/30; 326/26; 326/27; 327/108; 327/112

(58) Field of Classification Search .................... 326/30, 326/86; 327/108
See application file for complete search history.

(56) References Cited

U.S. PATENT DOCUMENTS

| 7,218,155 | B1 * | 5/2007 | Chang et al. | 327/108 |
| 7,221,193 | B1 * | 5/2007 | Wang et al. | 327/108 |
| 7,268,712 | B1 * | 9/2007 | Sheen | 341/120 |
| 7,514,954 | B2 * | 4/2009 | Kim et al. | 326/30 |
| 2009/0146694 | A1 * | 6/2009 | Kim et al. | 327/77 |

FOREIGN PATENT DOCUMENTS

| KR | 1020090022043 | 3/2009 |
| KR | 1020090061279 | 6/2009 |

* cited by examiner

*Primary Examiner* — Vibol Tan
(74) *Attorney, Agent, or Firm* — IP & T Group LLP (57) ABSTRACT

An impedance adjusting device includes: a calibration node; a comparison unit configured to compare a reference voltage with a voltage of the calibration node; a counting unit configured to generate an impedance code according to a comparison result of the comparison unit; a reference impedance unit having an impedance value according to the impedance code and connected to the calibration node; a storage unit configured to store the comparison result of the comparison unit upon the generation of the impedance code being completed; an interface node; and a termination unit configured to terminate the interface node, the termination unit including a plurality of parallel resistors configured to be turned on/off according to the impedance code, and a parallel resistor configured to be turned on/off according to a value stored in the storage unit.

11 Claims, 7 Drawing Sheets

IMPEDANCE ADJUSTING DEVICE

CROSS-REFERENCE TO RELATED APPLICATIONS

The present application claims priority of Korean Patent Application No. 10-2009-0117428, filed on Nov. 30, 2009, which is incorporated herein by reference in its entirety.

BACKGROUND OF THE INVENTION

An embodiment of the present invention relates to an impedance adjusting device for matching impedances of input/output pads for communication with external circuits in a semiconductor device.

A variety of semiconductor devices are implemented with integrated circuit chips, such as CPUs, memories, and gate arrays. Such semiconductor devices are incorporated in various electronic products, such as personal computers, servers, and workstations. In most cases, semiconductor devices include receiving circuits to receive a variety of external signals through input pads, and output circuits to output a variety of internal signals through output pads.

Meanwhile, as the operating speeds of the electronic products increase, amplitude swings of signals transmitted between semiconductor devices have been gradually reduced in order to minimize the delay time to transfer signals. However, as the amplitude swings of the signals are reduced, the influence of external noise is increased, and signal reflectivity due to impedance mismatching at interfaced terminals becomes more severe. The impedance mismatching is caused by external noise or variations in power supply voltage, operating temperature or fabrication process. When impedance mismatching occurs, high-speed data transmission may be difficult, and data outputted from data output terminals of the semiconductor device may be distorted. Therefore, when the receiving circuit of the semiconductor device receives the distorted output signals through the input terminals, setup/hold failure or an incorrect determination of input levels may frequently occur.

Specifically, in order to solve the above-described problems, memory devices requiring high-speed operations have adopted impedance matching circuits, called on-die terminations (ODTs), in the vicinity of pads located within integrated circuit chips. In a typical ODT scheme, a source termination is performed at a transmission side by an output circuit, and a parallel termination is performed at a reception side by a termination circuit connected in parallel to the reception circuit connected to an input pad.

A ZQ calibration is a process of generating impedance codes which change according to variations of process, voltage and temperature (PVT) conditions. A termination impedance value is adjusted using the impedance codes generated as a result of the ZQ calibration. Generally, a pad to which an external resistor serving as a calibration reference is connected is referred to as a ZQ pad. For this reason, the term "ZQ calibration" is widely used.

Hereinafter, a calibration circuit for generating impedance codes and a termination circuit for terminating an input/output node using the generated impedance codes is described.

Figure 1:
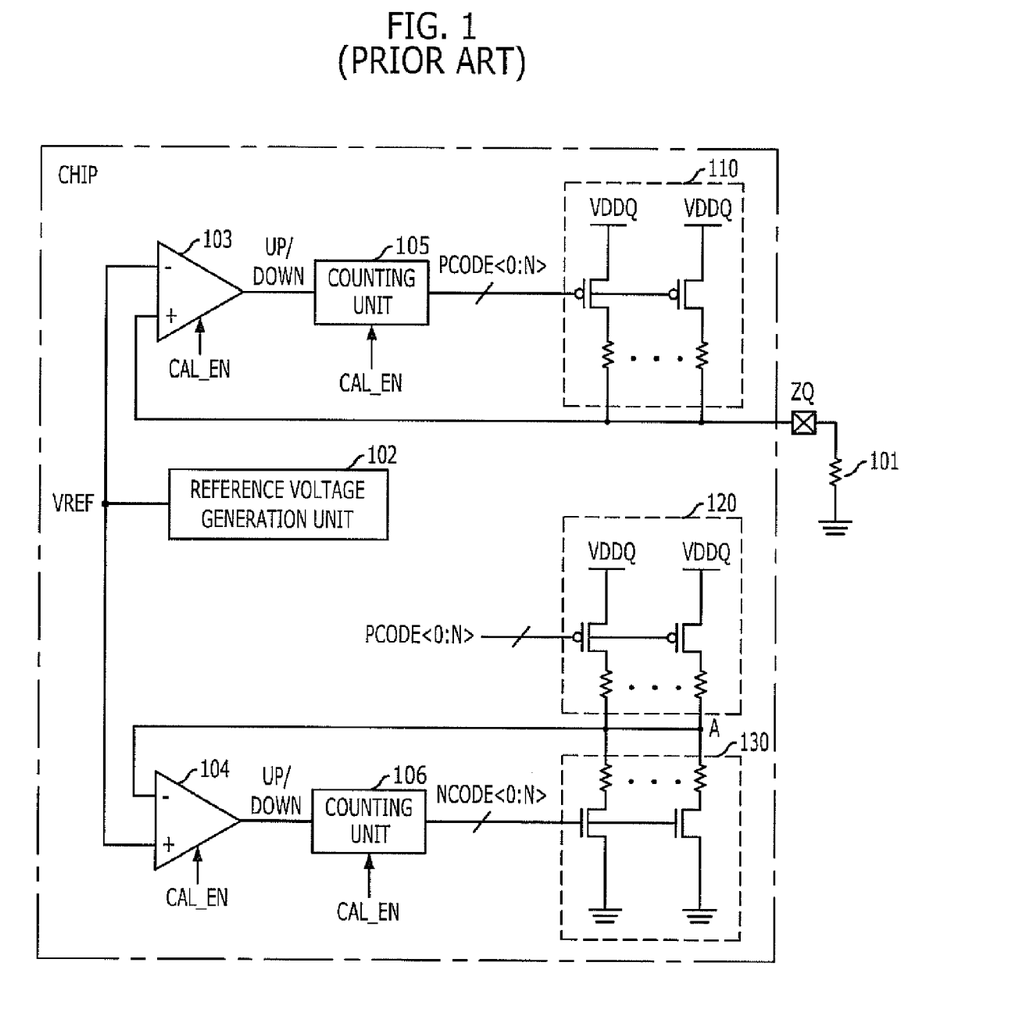
FIG. 1 is a diagram of a conventional calibration circuit.

FIG. 1 is a diagram of a conventional calibration circuit.

Referring to FIG. 1, the conventional calibration circuit includes a pull-up reference impedance unit 110, a dummy reference impedance unit 120, a pull-down reference impedance unit 130, a reference voltage generation unit 102, comparison units 103 and 104, and counting units 105 and 106.

During the operation of the conventional calibration circuit of FIG. 1, the comparison unit 103 compares a voltage of a calibration node ZQ, generated by a voltage division between an external resistor 101 (hereinafter, assumed to be 120Ω) connected to a calibration pad and the pull-up reference impedance unit 110, with a reference voltage VREF (generally, ½*VDDQ), generated by the reference voltage generation unit 102, and generates an up/down signal UP/DOWN.

The counting unit 105 receives the up/down signal UP/DOWN to generate a pull-up impedance code PCODE<0:N>. The generated pull-up impedance code PCODE<0:N> is used to adjust the total impedance value of the pull-up impedance unit 110 by turning on/off parallel resistors within the pull-up reference impedance unit 110 (the impedance values of the parallel resistors are chosen according to binary weights). The adjusted total impedance value of the pull-up reference impedance unit 110 determines the voltage of the calibration node ZQ, and the above-described operations are repeated. Consequently, the pull-up impedance code PCODE<0:N> is counted up until the total impedance value of the pull-up reference impedance unit 110 is equal to the impedance value of the external resistor 101 (pull-up calibration).

The pull-up impedance code PCODE<0:N>, generated by the above-described pull-up calibration operation, is inputted to the dummy reference impedance unit 120 and used to determine a total impedance value of the dummy reference impedance unit 120. Subsequently, a pull-down calibration operation is performed. In the similar manner to the pull-up calibration operation discussed above, the pull-down calibration operation is performed using the comparison unit 104 and the counting unit 106, so that a voltage of a node A is equal to the reference voltage VREF; that is, the total impedance value of the pull-down reference impedance unit 130 is equal to the total impedance value of the dummy reference impedance unit 120 (pull-down calibration).

The impedance code PCODE<0:N>, generated as the result of the above-described ZQ calibration operation, is inputted to a termination circuit (see FIG. 2) and used to adjust a termination impedance value.

The calibration circuit does not always operate, but rather only operates for a preset time duration during a set period. For example, for a DDR3 memory device, the calibration operation is performed during 512 clock cycles of an initial mode. After the initial mode, the calibration operation is performed during 256 clock cycles or 64 clock cycles according to a command. During the calibration operation, a calibration enable signal CAL_EN is activated. When the calibration enable signal CAL_EN is activated, the comparison units 103 and 104 and the counting units 105 and 106 operate. On the other hand, when the calibration enable signal CAL_EN is deactivated, the comparison units 103 and 104 and the counting units 105 and 106 do not operate. That is, when the calibration enable signal CAL_EN is activated, the comparison units 103 and 104 perform the comparison operations once during each clock cycle, and the counting units 105 and 106 perform the counting operations once during each clock cycle. However, when the calibration enable signal CAL_EN is deactivated, the comparison units 103 and 104 and the counting units 105 and 106 do not operate, and the impedance code PCODE<0:N> is not changed.

Figure 2:
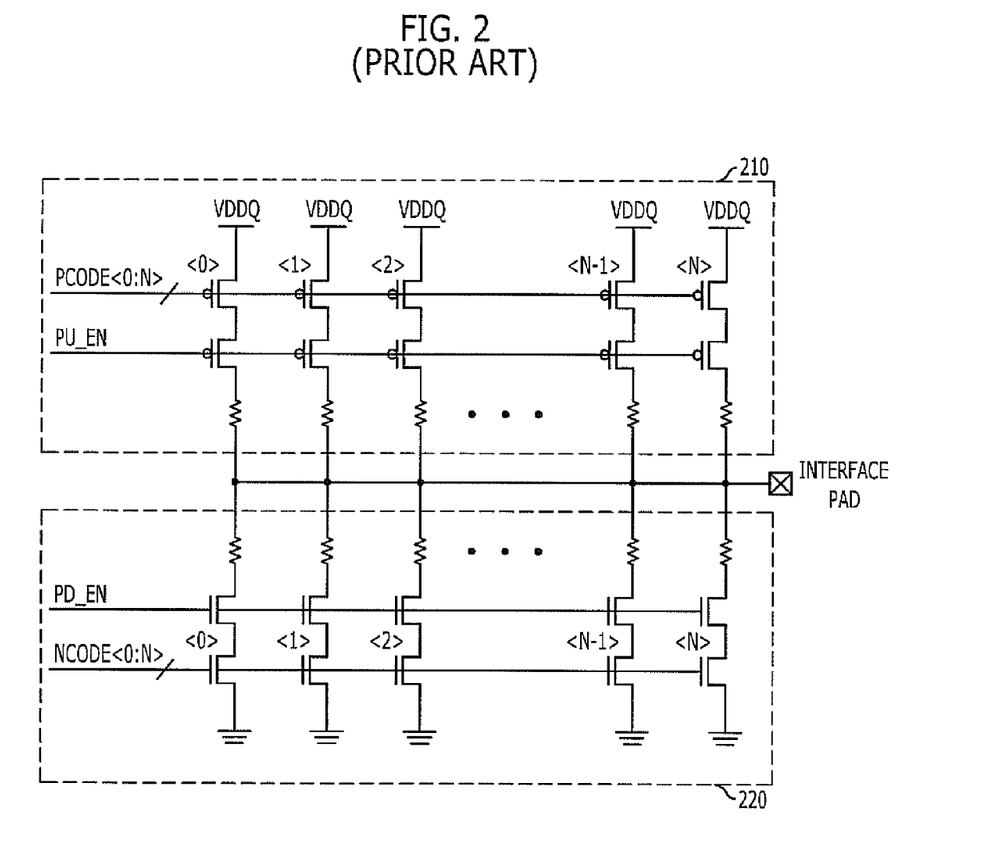
FIG. 2 is a circuit diagram of a conventional termination circuit.

FIG. 2 is a circuit diagram of a conventional termination circuit.

The termination circuit receives the impedance codes PCODE<0:N> and NCODE<0:N>, generated by the calibration circuit of FIG. 1, and terminates the interface pad.

The termination circuit includes a pull-up termination impedance unit 210 and a pull-down termination impedance unit 220. The termination circuit may be configured with either the pull-up termination impedance unit 210 or the pull-down termination impedance unit 220 according to the termination scheme.

The pull-up termination impedance unit 210 is designed to have a configuration which is similar to that of the pull-up reference impedance unit 110, and receives the pull-up impedance code PCODE<0:N>. Therefore, the pull-up termination impedance unit 210 has the same impedance value as the pull-up reference impedance unit 110. It is apparent that the pull-up termination impedance unit 210 may be designed to have ½ times or 2 times the impedance value of the pull-up reference impedance unit 110 through a scaling. A pull-up termination enable signal PU_EN is a signal which turns on/off the pull-up termination impedance unit 210. When the pull-up termination enable signal PU_EN is deactivated, all of the resistors within the pull-up termination impedance unit 210 are turned off. On the other hand, when the pull-up termination enable signal PU_EN is activated, the resistors within the pull-up termination impedance unit 210 are turned on/off according to the pull-up impedance code PCODE<0:N>.

The pull-down termination impedance unit 220 has a configuration which is similar to that of the pull-down reference impedance unit 130, and receives the pull-down impedance code NCODE<0:N>. Therefore, the pull-down termination impedance unit 220 has the same impedance value as the pull-down reference impedance unit 130. It is apparent that the pull-down termination impedance unit 220 may be designed to have ½ or 2 times the impedance value of the pull-down reference impedance unit 130 through a scaling. A pull-down termination enable signal PD_EN is a signal which turns on/off the pull-down termination impedance unit 220. When the pull-down termination enable signal PD_EN is deactivated, all of the resistors within the pull-down termination impedance unit 220 are turned off. On the other hand, when the pull-down termination enable signal PD_EN is activated, the resistors within the pull-down termination impedance unit 220 are turned on/off according to the pull-down impedance code NCODE<0:N>.

The above-described termination circuit may constitute an output driver configured to output data. When the pull-up termination enable signal PU_EN is activated, the pull-up termination impedance unit 210 generates a "high" level at an interface pad (in this case, a pad DQ). Thus, "high" data is outputted through the interface pad. Furthermore, when the pull-down termination enable signal PD_EN is activated, the pull-down termination impedance unit 220 generates a "low level" at the interface pad. Thus, "low" data is outputted through the interface pad.

Figure 3:
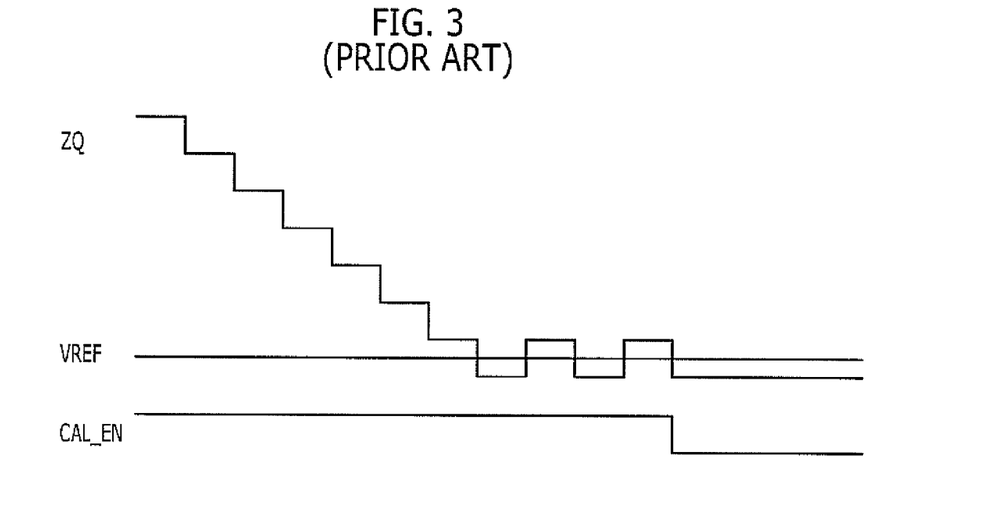
FIG. 3 illustrates the variation in the voltage of a calibration node according to the calibration operation of the calibration circuit.

FIG. 3 illustrates the variation in the voltage of the calibration node according to the calibration operation of the calibration circuit.

Referring to FIG. 3, as the calibration operation progresses, the calibration node ZQ voltage gradually moves closer to the reference voltage VREF. However, after a passage of a set period of time, the calibration node ZQ voltage is no longer close to the reference voltage VREF. Since the impedance value of the pull-up reference impedance unit 110 is determined by the pull-up impedance code PCODE<0:N>, the calibration node ZQ voltage varies with a predetermined voltage swing. The calibration node ZQ voltage is different from the reference voltage VREF in that the impedance value of the pull-up reference impedance unit 110 is different from the impedance value of the external resistor 101. Therefore, as the calibration node ZQ voltage gets closer to the reference voltage VREF, the accuracy of the calibration operation is further increased.

In order to cause the calibration node ZQ voltage to move closer to the reference voltage VREF, a method of reducing a quantization error by increasing the number of bits of the impedance codes PCODE<0:N> and NCODE<0:N> may be considered. However, if the number of bits of the impedance codes PCODE<0:N> and NCODE<0:N> is increased, then the complexity of the calibration circuit is also increased. Furthermore, whenever the number of bits is increased by one, the time necessary for the calibration operation is increased two times. Consequently, there is a need for technology which can increase the accuracy of the calibration operation, without increasing the complexity of the calibration circuit and the time necessary for the calibration operation.

SUMMARY OF THE INVENTION

An embodiment of the present invention is directed to an impedance adjusting device which is capable of increasing the accuracy of the calibration and termination operations, without increasing the number of impedance code bits.

According to an embodiment of the present invention, an impedance adjusting device includes: a comparison unit configured to compare a reference voltage with a voltage of a calibration node; a counting unit configured to generate an impedance code according to a comparison result of the comparison unit; a reference impedance unit configured to have an impedance value determined by the impedance code and connected to the calibration node; a storage unit configured to store the comparison result of the comparison unit upon the generation of the impedance code being completed; and a termination unit configured to terminate an interface node, the termination unit including a plurality of parallel resistors configured to be turned on/off in response to the impedance code, and a parallel resistor configured to be turned on/off in response to a signal stored in the storage unit.

The interface node may include a node connected to a data pad through which data is inputted or outputted.

The comparison unit and the counting unit may be configured to operate at a predetermined time period during a calibration operation, and the storage unit is configured to store a final comparison result of the comparison unit.

According to another embodiment of the present invention, an impedance adjusting device includes: a first comparison unit configured to compare a reference voltage with a voltage of a first calibration node; a first counting unit configured to generate a pull-up impedance code according to a comparison result of the first comparison unit; a pull-up reference impedance unit configured to have an impedance value according to the pull-up impedance code and to pull up the first calibration node; a dummy reference impedance unit configured to have an impedance value according to the pull-up impedance code and to pull up a second calibration node; a second comparison unit configured to compare the reference voltage with the voltage of the second calibration node; a second counting unit configured to generate a pull-down impedance code according to a comparison result of the second comparison unit; a pull-down reference impedance unit configured to have an impedance value according to the pull-down impedance code and to pull down the second calibration node; a storage unit configured to store the comparison result of the second comparison unit upon the generation of the pull-up and pull-down impedance codes being completed; a pull-up termination unit configured to pull-up terminate an interface node, the pull-up termination unit including a plurality of parallel resistors configured to be turned on/off according to the pull-up impedance code, and a resistor configured to be turned on/off according to a value stored in the storage unit; and a pull-down termination unit configured to pull-down terminate the interface node, the pull-down termination unit including a plurality of parallel resistors configured to be turned on/off according to the pull-down impedance code, and a resistor configured to be turned on/off according to the value stored in the storage unit.

According to yet another embodiment of the present invention, an impedance adjusting device includes: a first comparison unit configured to compare a reference voltage with a voltage of a first calibration node; a first counting unit configured to generatea pull-up impedance code according to a comparison result of the first comparison unit; a pull-up reference impedance unit configured to have an impedance value according to the pull-up impedance code and to pull up the first calibration node; a dummy reference impedance unit configured to have an impedance value according to the pull-up impedance code and to pull up a second calibration node; a second comparison unit configured to compare the reference voltage with the voltage of the second calibration node; a second counting unit configured to generatea pull-down impedance code according to a comparison result of the second comparison unit; a storage unit configured to store a comparison result of the first comparison unit upon the generation of the pull-up and pull-down impedance codes being completed; a pull-down termination unit configured to pull-up terminate an interface node, the pull-up termination unit including a plurality of parallel resistors configured to be turned on/off according to the pull-up impedance code, and a resistor configured to be turned on/off according to a value stored in the storage unit; and a pull-down termination unit configured to pull-down terminate the interface node, the pull-down termination unit including a plurality of parallel resistors configured to be turned on/off according to the pull-down impedance code, and a resistor configured to be turned on/off according to the value stored in the storage unit.

According to still another embodiment of the present invention, an impedance adjusting device includes: a calibration circuit configured to compare a voltage of a calibration node and a reference voltage, count a comparison result, generate an impedance code, and store a final comparison result; and a termination circuit configured to having an impedance value according to the impedance code and the final comparison result.

DESCRIPTION OF THE INVENTION

Exemplary embodiments of the present invention are described below in detail with reference to the accompanying drawings. The present invention may, however, be embodied in different forms and should not be construed as being limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

An impedance adjusting device includes a calibration circuit and a termination circuit.

Figure 4:
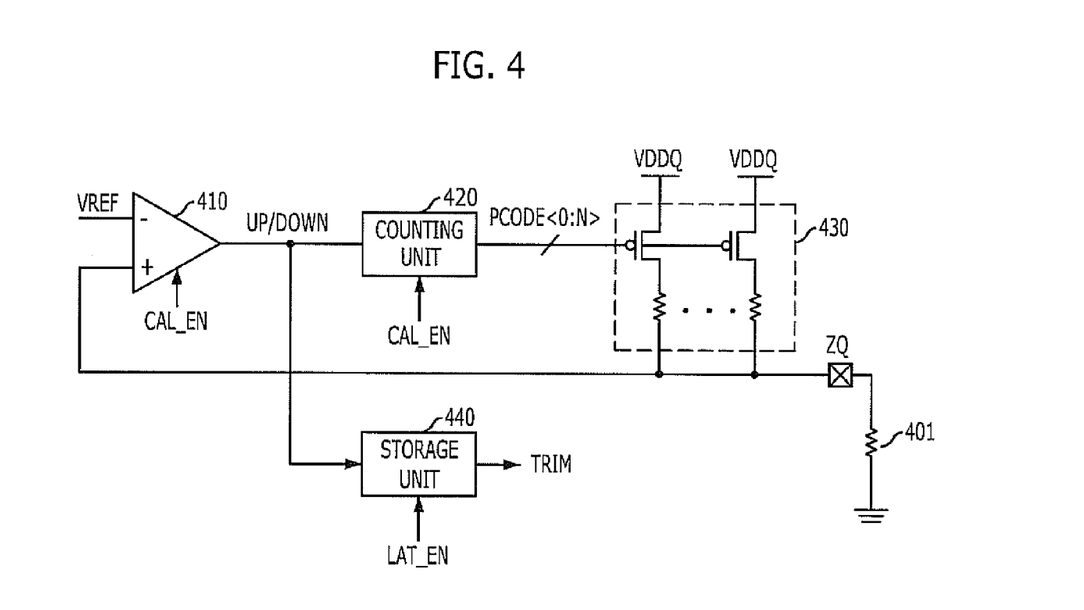
FIG. 4 is a diagram of a calibration circuit of an impedance adjusting device according to a first embodiment of the present invention.

FIG. 4 is a diagram of a calibration circuit of an impedance adjusting device according to a first embodiment of the present invention. In the first embodiment of the present invention, the calibration circuit (see FIG. 4) generates a single impedance code, and the termination circuit (see FIG. 6) terminates an interface node in a single direction.

The calibration circuit is configured to compare a calibration node ZQ voltage with a reference voltage VREF, count an UP/DOWN comparison result, and generate an impedance code PCODE<0:N>. The calibration circuit stores a final UP/DOWN comparison result. Specifically, as illustrated in FIG. 4, the calibration circuit includes a comparison unit 410, a counting unit 420, a reference impedance unit 430, and a storage unit 440. The comparison unit 410 compares the reference voltage VREF with the calibration node ZQ voltage. The counting unit 420 is configured to count the impedance code PCODE<0:N> according to the UP/DOWN comparison result of the comparison unit 410. The reference impedance unit 430 has an impedance value determined by the impedance code PCODE<0:N> and is connected to the calibration node ZQ. The storage unit 440 stores the UP/DOWN comparison result of the comparison unit 410 when the generation of the impedance code PCODE<0:N> has been completed. A calibration enable signal CAL_EN, inputted to the comparison unit 410 and the counting unit 420, enables the calibration operation. While the calibration enable signal CAL_EN is activated, the comparison unit 410 and the counting unit 420 generate the impedance code PCODE<0:N>. While the calibration enable signal CAL_EN is deactivated, the comparison unit 410 and the counting unit 420 stop operating, and the value of the impedance code PCODE does not change.

Unlike the conventional calibration circuit, the calibration circuit of FIG. 4 further includes the storage unit 440, as well as the section which generates the impedance code PCODE<0:N>.

The storage unit 440 stores the UP/DOWN comparison result of the comparison unit 410 when the generation of the impedance code PCODE<0:N> has been completed. Storing the UP/DOWN comparison result of the comparison unit 410 when the generation of the impedance code PCODE<0:N> has been completed includes storing the UP/DOWN comparison result generated by the final comparison operation of the comparison unit 410 within the calibration operation time period. The storage unit 440 operates in response to a latch enable signal LAT_EN. The latch enable signal LAT_EN may be activated immediately before the deactivation time period of the calibration enable signal CAL_EN.

The storage unit 440 stores the final UP/DOWN comparison result obtained within the calibration operation time period. If the final UP/DOWN comparison result is high, the counting of the final impedance code PCODE<0:N> is performed in a direction which increases the impedance value of the reference impedance unit 430. On the other hand, if the final UP/DOWN comparison result is low, the counting of the final impedance code PCODE<0:N> is performed in a direction which decreases the impedance value of the reference impedance unit 430. Therefore, if the final UP/DOWN comparison result is a high value, the impedance value of the reference impedance unit 430 is made larger than the impedance value of the external resistor 401. If the final UP/DOWN comparison result is a low value, the impedance value of the reference impedance unit 430 is made smaller than the impedance value of the external resistor 401.

As such, a TRIM value stored in the storage unit 440 has information as to which of the impedance value of the external resistor 401 and the impedance value of the reference impedance unit 430 is larger after the generation of the impedance code PCODE<0:N> has been completed. That is, the TRIM value stored in the storage unit 440 has information as to which direction the quantization error occurs after the calibration operation has been completed.

Although a comparator is illustrated in FIG. 4 as an example of the comparison unit 410, a variety of circuits designed to perform the comparison operation may also be used. Moreover, although a counter is illustrated in FIG. 4 as an example of the counting unit 420, a variety of circuits designed to increase/decrease the value of the impedance code PCODE<0:N> (to increase/decrease the code of the activated signal) according to the comparison result may also be used.

Figure 5A:
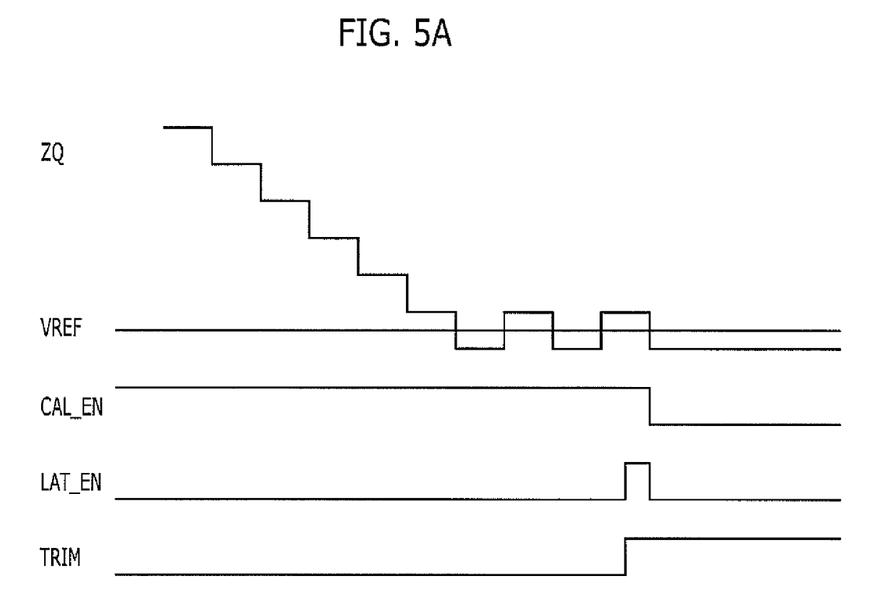
FIGS. 5A and 5B illustrate the process in which the calibration node ZQ voltage changes according to the calibration operation and the process in which a TRIM value is stored in a storage unit 440.
Figure 5B:
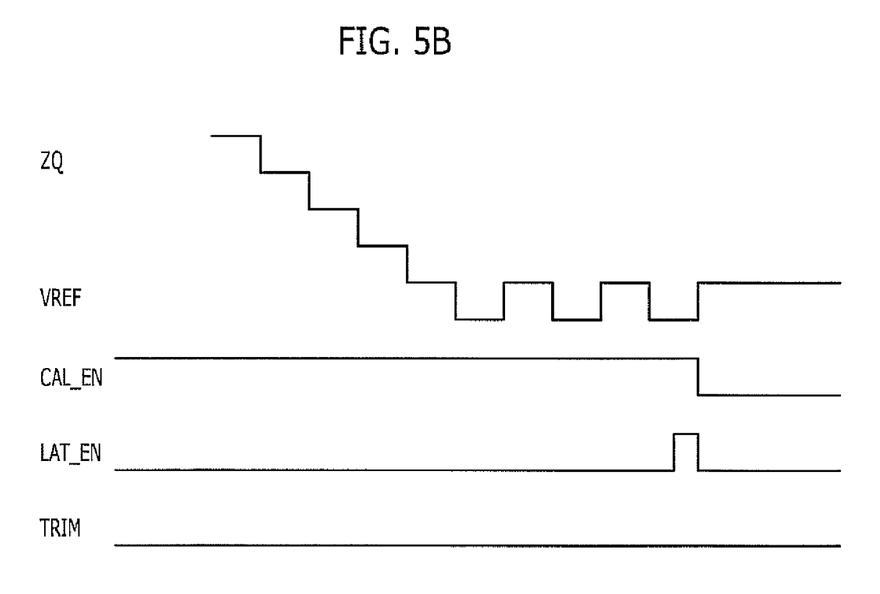

FIGS. 5A and 5B illustrate the process in which the calibration node ZQ voltage changes according to the calibration operation and the process in which the TRIM value is stored in the storage unit 440.

Referring to FIG. 5A, the impedance code PCODE<0:N> is changed by the operation of the comparison unit 410 and the counting unit 420 and accordingly, the calibration node ZQ voltage is moved toward the reference voltage VREF. After a set period of time, the calibration node ZQ voltage repetitively becomes first higher and then lower than the reference voltage VREF. When the calibration operation has been completed, that is, the calibration enable signal CAL_EN has been deactivated, the value of the impedance code PCODE<0:N> does not change, and the calibration node ZQ voltage is kept lower than the reference voltage VREF. The voltage of the calibration node ZQ becomes lower than the reference voltage VREF because the final UP/DOWN comparison result of the comparison unit 410 is a high value and thus, the impedance code PCODE<0:N> is counted in a direction which increases the impedance value of the reference impedance unit 430. The high value, which is the final UP/DOWN comparison result of the comparison unit 410, is stored in the storage unit 440 (TRIM=HIGH).

Referring to FIG. 5B, the impedance code PCODE<0:N> is changed by the operation of the comparison unit 410 and the counting unit 420 and thus the voltage of the calibration node ZQ is moved toward the reference voltage VREF. After a certain time point, the voltage of the calibration node ZQ repetitively becomes higher and lower than the reference voltage VREF. When the calibration operation is completed, that is, the calibration enable signal CAL_EN is deactivated, the value of the impedance code PCODE<0:N> does not change, and the voltage of the calibration node ZQ is kept higher than the reference voltage VREF. The reason why the voltage of the calibration node ZQ becomes higher than the reference voltage VREF is that the final comparison result UP/DOWN of the comparison unit 410 is low and thus the impedance code PCODE<0:N> is counted in a direction which decreases the impedance value of the reference impedance unit 430. The low value which is the final comparison result UP/DOWN of the comparison unit 410 is stored in the storage unit 440 (TRIM=LOW).

Figure 6:
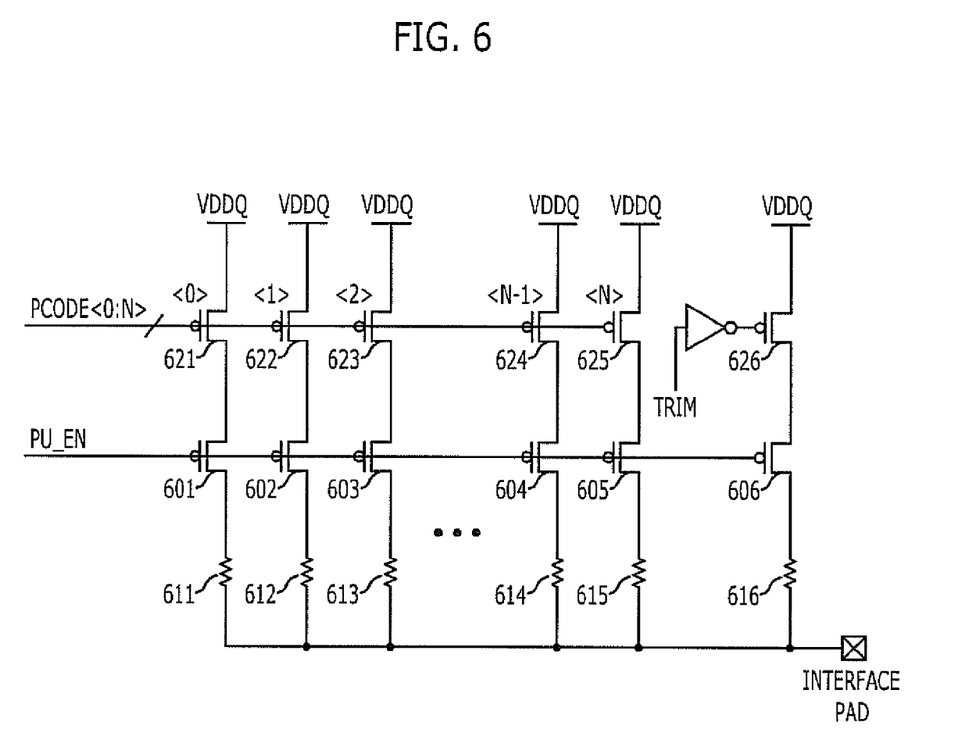
FIG. 6 is a circuit diagram of the terminal circuit of the impedance adjusting device according to the first embodiment of the present invention.

FIG. 6 is a configuration diagram of the terminal circuit of the impedance adjusting device according to the first embodiment of the present invention.

The impedance value of the termination circuit is determined according to the impedance code PCODE<0:N> and the final comparison result TRIM stored in the storage unit 440. Referring to FIG. 6, the termination circuit includes a plurality of parallel resistors 611 to 615 configured to be turned on/off in response to the impedance code PCODE<0:N>, and a parallel resistor 616 configured to be turned on/off in response to the TRIM value stored in the storage unit 440. An interface node to which the interface pad is connected is terminated using the resistors 611 to 615 and 616.

Transistors 601 to 606 configured to be turned on/off in response to the termination enable signal PU_EN are connected in series to the resistors 611 to 615 and 616 inside the termination circuit. When the termination enable signal PU_EN is deactivated to a high level, the resistors 611 to 615 and 616 are turned off. On the other hand, when the termination enable signal PU_EN is activated to a low level, the resistors 611 to 615 and 616 are turned on/off by the impedance code PCODE<0:N> or the TRIM value stored in the storage unit 440.

The following description will be made on the assumption that the termination enable signal PU_EN is activated to a low level.

Transistors 621 to 625 configured to receive the impedance code PCODE<0:N> are connected in series to the resistors 611 to 615. Therefore, the resistors 611 to 615 are turned on/off by the impedance code PCODE<0:N>. This operation is identical to that of the conventional termination circuit.

The resistor 616 is turned on when the TRIM value stored in the storage unit 440 is high, and turned off when the TRIM value stored in the storage unit 440 is low. This operation is possible because the transistor 626 receiving the inverted TRIM value stored in the storage unit 440 is connected in series to the resistor 616.

As described above, the TRIM value is high when the current impedance value of the reference impedance unit 430 is greater than the impedance value (target value) of the external resistor 401, and the TRIM value is low when the current impedance value of the reference impedance unit 430 is smaller than the impedance value (target value) of the external resistor 401. The termination circuit tends to have the same impedance as the reference impedance unit 430. That is, when the impedance value of the reference impedance unit 430 is greater than the target value, the impedance value of the termination circuit is also greater than the target value. When the impedance value of the reference impedance unit 430 is smaller than the target value, the impedance value of the termination circuit is also smaller than the target value. The resistor 601 decreases the impedance value of the termination value when it is greater than the target value, and increases the impedance value of the termination value when it is smaller than the target value.

Although the resistors 601 to 615 and 616 and the transistors 601 to 606 and 621 to 626, which turn on/off the resistors 601 to 615 and 616, are separately illustrated in FIG. 6, the termination circuit may include only the transistors 601 to 606 and 621 to 626, without any resistors, because the transistors 601 to 606 and 621 to 626 have resistance components in themselves. In this case, the resistors in this embodiment may refer to the transistors.

Although the calibration circuit generates the pull-up impedance code PCODE<0:N> and the termination circuit terminates the interface node in the pull-up direction have been exemplarily described above with reference to FIGS. 4 to 6, it is apparent that the calibration circuit may generate the pull-down impedance code and the termination circuit may terminate the interface node in the pull-down direction.

Figure 7:
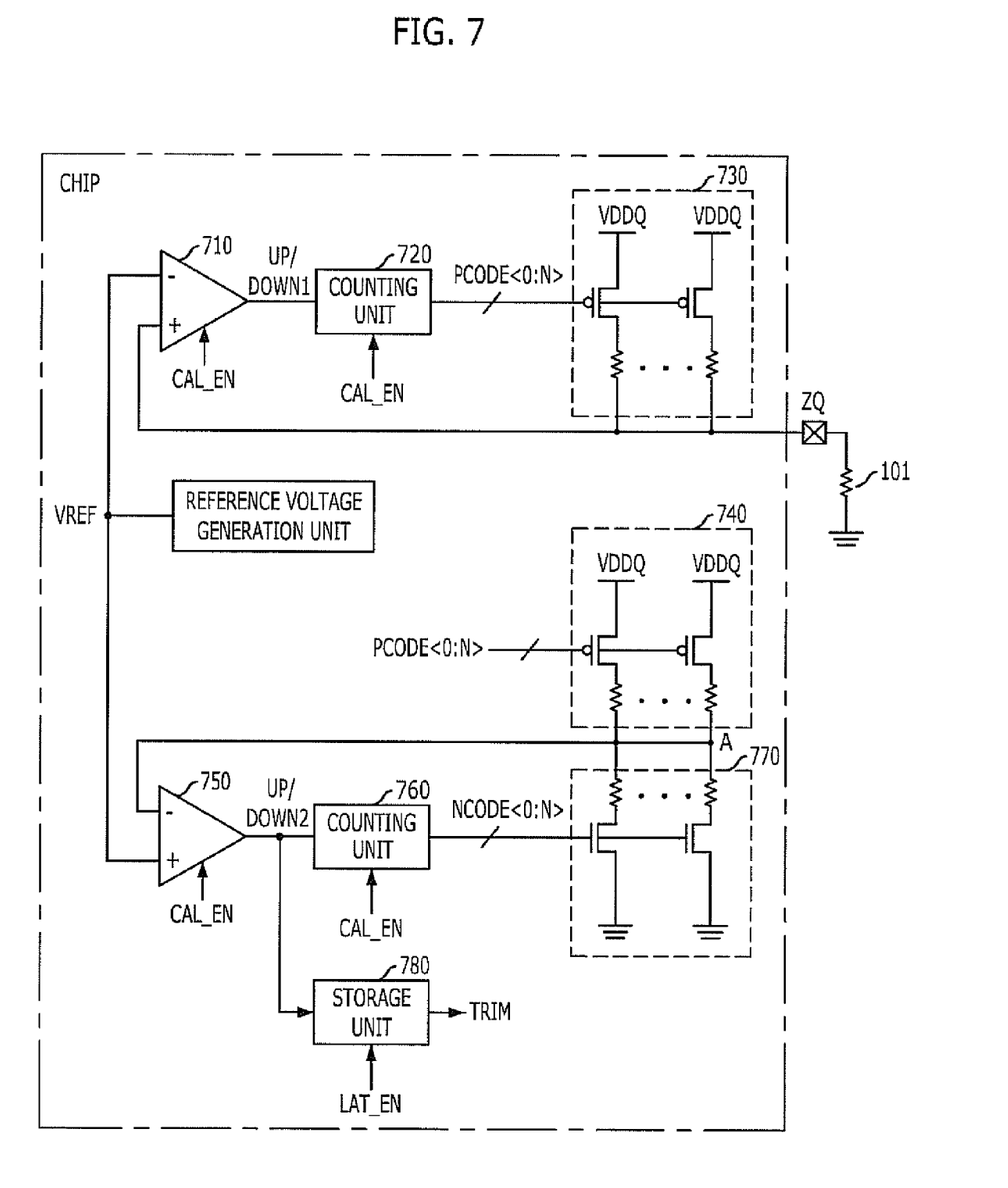
FIG. 7 is a diagram of a calibration circuit of an impedance adjusting device according to a second embodiment of the present invention.

FIG. 7 is a diagram of a calibration circuit of an impedance adjusting device according to a second embodiment of the present invention. In the second embodiment of the present invention, the calibration circuit (see FIG. 7) generates two impedance codes, and the termination circuit (see FIG. 8) terminates an interface node in both pull-up and pull-down directions.

The calibration circuit is compares voltages of calibration nodes ZQ and A with a reference voltage VREF, counts comparison results UP/DOWN1 and UP/DOWN2, and generates impedance codes PCODE<0:N> and NCODE<0:N>. The calibration circuit stores a final UP/DOWN2 comparison result. Specifically, as illustrated in FIG. 7, the calibration circuit includes a first comparison unit 710, a first counting unit 720, a pull-up reference impedance unit 730, a dummy reference impedance unit 740, a second comparison unit 750, a second counting unit 760, a pull-down reference impedance unit 770, and a storage unit 780. The first comparison unit 710 compares the reference voltage VREF with the first calibration node ZQ voltage. The first counting unit 720 counts up the pull-up impedance code PCODE<0:N> according to the UP/DOWN1 comparison result of the first comparison unit 710. The pull-up reference impedance unit 730 has an impedance value determined by the pull-up impedance code PCODE<0:N> and pull up the first calibration node ZQ. The dummy reference impedance unit 740 has an impedance value determined by the pull-up impedance code PCODE<0:N> and pulls up the second calibration node A. The second comparison unit 750 compares the reference voltage VREF with the voltage of the second calibration node A. The second counting unit 760 counts the pull-down impedance code NCODE<0:N> according to the UP/DOWN2 comparison result of the second comparison unit 750. The pull-down reference impedance unit 770 has an impedance value determined by the pull-down impedance code NCODE<0:N> and pulls down the second calibration node A. The storage unit 780 stores the UP/DOWN2 comparison result of the second comparison unit 750 when the generation of the pull-up impedance code PCODE<0:N> and the pull-down impedance code NCODE<0:N> have been completed. A calibration enable signal CAL_EN inputted to the first and second comparison units 710 and 750 and the first and second counting units 720 and 760 enables the calibration operation. While the calibration enable signal CAL_EN is activated, the first and second comparison units 710 and 750 and the first and second counting units 720 and 760 generate the pull-up impedance code PCODE<0:N> and the pull-down impedance code NCODE<0:N>. While the calibration enable signal CAL_EN is deactivated, the first and second comparison units 710 and 750 and the first and second counting units 720 and 760 stop operating, and the values of the pull-up impedance code PCODE and the pull-down impedance code NCODE<0:N> do not change.

Unlike the conventional calibration circuit, the calibration circuit of FIG. 7 further includes the storage unit 440, as well as the section which generates the pull-up impedance code PCODE<0:N> and the pull-down impedance code NCODE<0:N>.

The storage unit 780 stores the UP/DOWN2 comparison result of the second comparison unit 750 when the generation of the pull-up impedance code PCODE<0:N> and the pull-down impedance code NCODE<0:N> has been completed. Storing the UP/DOWN2 comparison result of the second comparison unit 750 when the generation of the pull-up impedance code PCODE<0:N> and the pull-down impedance code NCODE<0:N> is completed includes storing the UP/DOWN2 comparison result generated by the final comparison operation of the second comparison unit 750 within the calibration operation period. The storage unit 780 operates in response to a latch enable signal LAT_EN. The latch enable signal LAT_EN may be activated when the calibration enable signal CAL_EN is deactivated.

The storage unit 780 stores the final UP/DOWN2 comparison result obtained within the calibration operation period. If the final UP/DOWN2 comparison result is a high value, the last updating of the pull-down impedance code NCODE<0:N> is performed in a direction which increases the impedance value of the pull-down reference impedance unit 770. On the other hand, if the final UP/DOWN2 comparison result is a low value, the last updating of the pull-down impedance code NCODE<0:N> is performed in a direction which decreases the impedance value of the pull-down reference impedance unit 770. Therefore, if the final comparison result UP/DOWN2 is a high value, the impedance value of the pull-down reference impedance unit 770 becomes greater than the impedance value of the dummy reference impedance unit 740. If the final comparison result is a low value, the impedance value of the pull-down reference impedance unit 770 becomes smaller than the impedance value of the dummy reference impedance unit 740.

As such, a TRIM value stored in the storage unit 780 has information as to which of the impedance value of the dummy reference impedance unit 740 and the impedance value of the pull-down reference impedance unit 770 is larger after the generation of the pull-up impedance code PCODE<0:N> and the pull-down impedance code NCODE<0:N> has been completed. That is, the TRIM value stored in the storage unit 780 has information as to which direction the quantization error occurs after the calibration operation has been completed.

Although the storage unit 780 stores the UP/DOWN2 comparison result of the second comparison unit 750, as illustrated in FIG. 7, the storage unit 780 may also store the UP/DOWN1 comparison result of the first comparison unit 710. This is because the final UP/DOWN1 comparison result of the first comparison unit 710 also has information as to which of the impedance value of the dummy reference impedance unit 740 and the impedance value of the pull-down reference impedance unit 770 is larger. In such a modification, the UP/DOWN1 comparison result must be inverted and then stored, or stored and then inverted. However, the basic principle of the embodiment of the present invention is identical.

Figure 8:
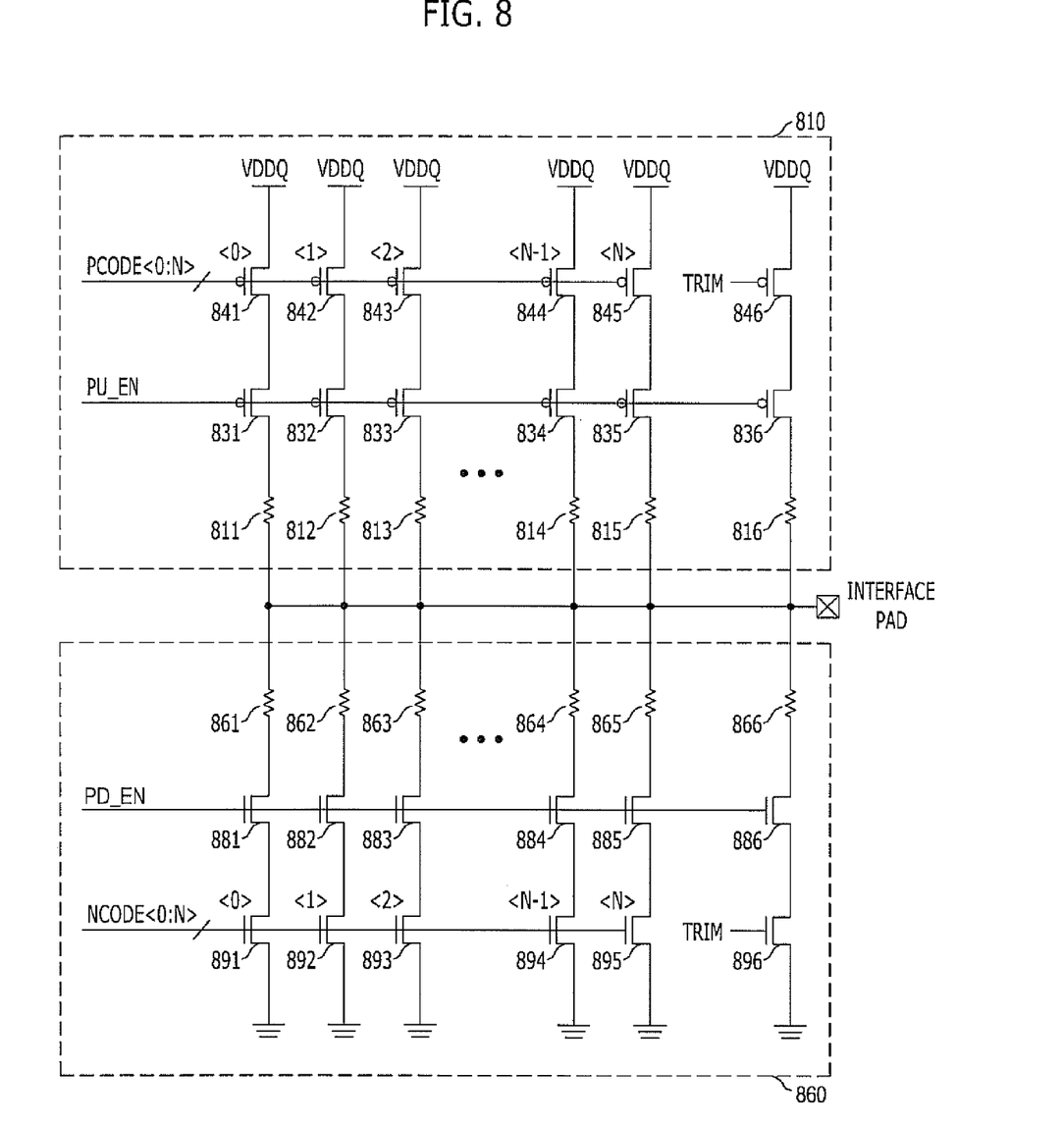
FIG. 8 is a circuit diagram of the terminal circuit of the impedance adjusting device according to the first embodiment of the present invention.

FIG. 8 is a diagram of the terminal circuit of the impedance adjusting device according to the first embodiment of the present invention.

The impedance value of the termination circuit is determined according to the impedance codes PCODE<0:N> and NCODE<0:N> and the final comparison result TRIM stored in the storage unit 780. Referring to FIG. 8, the termination circuit includes pull-up termination unit 810 to pull-up terminate the interface node to which the interface pad is connected, and a pull-down termination unit 860 to pull-down terminate the interface node.

The pull-up termination unit 810 includes a plurality of parallel resistors 811 to 815 which are turned on/off in response to the pull-up impedance code PCODE<0:N>, and a resistor 816 which is turned on/off in response to the TRIM value stored in the storage unit 780. Transistors 831 to 836, which are turned on/off in response to a pull-up termination enable signal PU_EN, are connected in series to the resistors 811 to 815 and 816 within the pull-up termination unit 810. When the pull-up termination enable signal PU_EN is deactivated to a high level, the resistors 811 to 815 and 816 are turned off. On the other hand, when the pull-up termination enable signal PU_EN is activated to a low level, the resistors 811 to 815 and 816 are turned on/off by the pull-up impedance code PCODE<0:N> or the TRIM value stored in the storage unit 780. The following description assumes that the pull-up termination enable signal PU_EN is activated to a low level.

Transistors 841 to 845 receive the pull-up impedance code PCODE<0:N> and are connected in series to the resistors 811 to 815. Therefore, the resistors 811 to 815 are turned on/off by the pull-up impedance code PCODE<0:N>. The resistor 816 is turned on when the TRIM value stored in the storage unit 780 is low, and turned off when the TRIM value stored in the storage unit 780 is high. This operation is possible because the transistor 846 receiving the TRIM value stored in the storage unit 780 is connected to the resistor 816.

The pull-down termination unit 860 includes a plurality of parallel resistors 861 to 865 which are turned on/off in response to the pull-down impedance code NCODE<0:N>, and a resistor 866 which is turned on/off in response to the TRIM value stored in the storage unit 780. Transistors 881 to 886 are turned on/off in response to a pull-down termination enable signal PD_EN and are connected in series to the resistors 861 to 865 and 866 within the pull-down termination unit 860. When the pull-down termination enable signal PD_EN is deactivated to a low level, the resistors 861 to 865 and 866 are turned off. On the other hand, when the pull-down termination enable signal PD_EN is activated to a high level, the resistors 861 to 865 and 866 are turned on/off by the pull-down impedance code NCODE<0:N> or the TRIM value stored in the storage unit 780. The following description assumes that the pull-down termination enable signal PD_EN is activated to a high level.

Transistors 891 to 895 receive the pull-down impedance code NCODE<0:N> and are connected in series to the resistors 861 to 865. Therefore, the resistors 861 to 865 are turned on/off by the pull-down impedance code NCODE<0:N>. The resistor 866 is turned on when the TRIM value stored in the storage unit 780 is high, and turned off when the TRIM value stored in the storage unit 780 is low. This operation is possible because the transistor 896 receiving the TRIM value stored in the storage unit 780 is connected to the resistor 866.

When the TRIM value stored in the storage unit 780 is high, the resistor 816 is turned off so that the impedance value of the pull-up termination unit 810 is increased, and the resistor 866 is turned on so that the impedance value of the pull-down termination unit 860 is increased. On the other hand, when the TRIM value stored in the storage unit 780 is low, the resistor 816 is turned on so that the impedance value of the pull-up termination unit 810 is decreased, and the resistor 866 is turned on so that the impedance value of the pull-down termination unit 860 is decreased.

As described above, the TRIM value is high when the impedance value of the pull-down reference impedance unit 770 is greater than the impedance value of the dummy reference impedance unit 740, and the TRIM value is low when the impedance value of the pull-down reference impedance unit 770 is smaller than the impedance value of the dummy reference impedance unit 740.

The dummy reference impedance unit 740 tends to have the same impedance as the pull-up termination unit 810, and the pull-down reference impedance unit 770 tends to have the same impedance as the pull-down termination unit 860. That is, when the impedance value of the dummy reference impedance unit 740 is greater than the impedance value of the pull-down reference impedance unit 770, the impedance value of the pull-up termination unit 810 is also greater than the impedance value of the pull-down termination unit 860. When the impedance value of the dummy reference impedance unit 740 is smaller than the impedance value of the pull-down reference impedance unit 770, the impedance value of the pull-up termination unit 810 is also smaller than the impedance value of the pull-down termination unit 860. The resistor 816 increases or decreases the impedance value of the pull-up termination unit 810, and the resistor 886 increases or decreases the impedance value of the pull-down termination unit 860. In this way, the pull-up termination unit 810 and the pull-down termination unit 860 are made to have the exact target impedance values.

According to the exemplary embodiments of the present invention, the impedance adjusting device stores the final comparison value (the comparison value finally generated within the calibration operation period), and finely adjusts the impedance value of the termination unit by using the stored final comparison value. Therefore, the accuracy of the impedance adjusting device is improved, without increasing the bit number of the impedance codes.

While the present invention has been described with respect to the specific embodiments, it will be apparent to those skilled in the art that various changes and modifications may be made without departing from the spirit and scope of the present invention as defined in the following claims.

What is claimed is:

1. An impedance adjusting device, comprising:
   a calibration node coupled to a first impedance;
   a comparison unit configured to compare a reference voltage with a voltage of the calibration node;
   a counting unit configured to generate an impedance code according to a comparison result of the comparison unit;
   a reference impedance unit connected to the calibration node and configured to have an impedance value according to the impedance code;
   a storage unit configured to store the comparison result of the comparison unit upon the generation of the impedance code being completed;
   an interface node; and
   a termination unit configured to receive the impedance code and the comparison result stored in the storage unit and terminate the interface node, the termination unit including a plurality of parallel resistors and an additional parallel resistor, wherein an overall impedance value of current paths through the plurality of the parallel resistors is adjusted according to the impedance code and an impedance value of a current path through the additional parallel resistor is adjusted according to the comparison result stored in the storage unit, wherein the comparison result stored in the storage unit has information as to which of an impedance value of the first impedance at the calibration node and the impedance value of the reference impedance unit is larger after the generation of the impedance code has been completed.

2. The impedance adjusting device of claim 1, wherein the interface node comprises a node connected to a data pad through which data is inputted or outputted.

3. The impedance adjusting device of claim 1, wherein the first impedance is an external resistor.

4. The impedance adjusting device of claim 1, wherein the comparison unit and the counting unit are configured to operate for a predetermined period of time during a calibration operation, and wherein the storage unit is configured to store a final comparison result of the comparison unit.

5. An impedance adjusting device, comprising:
a first calibration node;
a first comparison unit configured to compare a reference voltage with a voltage of the first calibration node;
a first counting unit configured to generate a pull-up impedance code according to a comparison result of the first comparison unit;
a pull-up reference impedance unit configured to have an impedance value according to the pull-up impedance code and to pull up the first calibration node;
a dummy reference impedance unit configured to have an impedance value according to the pull-up impedance code and to pull up a second calibration node;
a second comparison unit configured to compare the reference voltage with the voltage of the second calibration node;
a second counting unit configured to generate a pull-down impedance code according to a comparison result of the second comparison unit;
a pull-down reference impedance unit configured to have an impedance value according to the pull-down impedance code and to pull down the second calibration node;
a storage unit configured to store the comparison result of the second comparison unit upon the generation of the pull-up and pull-down impedance codes being completed;
an interface node;
a pull-up termination unit configured to pull-up terminate the interface node, the pull-up termination unit including a plurality of first parallel resistors and a first additional resistor, wherein an overall impedance value of current paths through the plurality of first parallel resistors is adjusted according to the pull-up impedance code and an impedance value of a current path through the first additional resistor is adjusted according to a value stored in the storage unit; and
a pull-down termination unit configured to pull-down terminate the interface node, the pull-down termination unit including a plurality of second parallel resistors and a second additional resistor, wherein an overall impedance value of current paths through the plurality of second parallel resistors is adjusted according to the pull-down impedance code and an impedance value of a current path through the second additional resistor is adjusted according to the value stored in the storage unit.

6. The impedance adjusting device of claim 5, wherein the interface node comprises a node connected to a data pad through which data is inputted or outputted.

7. The impedance adjusting device of claim 5, wherein the first calibration node is connected to an external resistor.

8. The impedance adjusting device of claim 5, wherein the first comparison unit, the second comparison unit, the first counting unit, and the second counting unit are configured to operate for a predetermined period of time during a calibration operation, and wherein the storage unit is configured to store a final comparison result of one of the first and second comparison units.

9. The impedance adjusting device of claim 5, wherein the pull-up termination unit includes a pull-up driver of an output driver and the pull-down termination unit includes a pull-down driver of the output driver, the pull-up driver being turned on upon high data being outputted, and the pull-down driver being turned on upon low data being outputted.

10. An impedance adjusting device, comprising:
a first calibration node;
a first comparison unit configured to compare a reference voltage with a voltage of the first calibration node;
a first counting unit configured to generate a pull-up impedance code according to a comparison result of the first comparison unit;
a pull-up reference impedance unit configured to have an impedance value according to the pull-up impedance code and to pull up the first calibration node;
a dummy reference impedance unit configured to have an impedance value according to the pull-up impedance code and to pull up a second calibration node;
a second comparison unit configured to compare the reference voltage with the voltage of the second calibration node;
a second counting unit configured to generate a pull-down impedance code according to a comparison result of the second comparison unit;
a storage unit configured to store a comparison result of the first comparison unit upon the generation of the pull-up and pull-down impedance codes being completed;
an interface node;
a pull-up termination unit configured to pull-up terminate the interface node, the pull-up termination unit including a plurality of first parallel resistors and a first additional resistor, wherein an overall impedance value of current paths through the plurality of first parallel resistors is adjusted according to the pull-up impedance code and an impedance value of a current path through the first additional resistor is adjusted according to a value stored in the storage unit; and
a pull-down termination unit configured to pull-down terminate the interface node, the pull-down termination unit including a plurality of second parallel resistors and a second additional resistor, wherein an overall impedance value of current paths through the plurality of second parallel resistors is adjusted according to the pull-down impedance code and an impedance value of a current path through the second additional resistor is adjusted according to the value stored in the storage unit.

11. An impedance adjusting device, comprising:
a calibration node;
a calibration circuit configured to compare a voltage of the calibration node and a reference voltage, to count a comparison result, to generate an impedance code, and to store a final comparison result; and
a termination circuit having an impedance value according to the impedance code and the final comparison result,
wherein the stored final comparison result has information as to which of the voltage of the calibration node and the reference voltage is larger after the generation of the impedance code has been completed.

* * * * *